(12) United States Patent
Tayler et al.

(10) Patent No.: US 7,015,726 B1
(45) Date of Patent: Mar. 21, 2006

(54) EDGE DETECTOR AND METHOD

(75) Inventors: Michael Kennard Tayler, Loveland, CO (US); Quanhong Zhu, Windsor, CO (US); Don Douglas Josephson, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/926,235

(22) Filed: Aug. 25, 2004

(51) Int. Cl.
*H03K 5/22* (2006.01)

(52) U.S. Cl. .......................................... 327/24; 327/12
(58) Field of Classification Search ................. 327/24, 327/12
See application file for complete search history.

(56) References Cited

U.S. PATENT DOCUMENTS

| | | | |
|---|---|---|---|
| 4,980,577 A | 12/1990 | Baxter | |
| 5,155,380 A | 10/1992 | Hwang et al. | |
| 5,231,636 A | 7/1993 | Rasmussen | |
| 5,313,154 A * | 5/1994 | Norris | ...................... 324/76.48 |
| 5,315,181 A | 5/1994 | Schowe | |
| 6,107,841 A | 8/2000 | Goodnow | |
| 6,194,927 B1 * | 2/2001 | Crowley et al. | ............. 327/147 |
| 2002/0050842 A1 * | 5/2002 | Soda | ............................ 327/24 |
| 2003/0095619 A1 | 5/2003 | Vallet et al. | |
| 2005/0162199 A1 * | 7/2005 | Green et al. | ................. 327/156 |

* cited by examiner

*Primary Examiner*—Kenneth B. Wells
*Assistant Examiner*—Khareem E. Almo

(57) ABSTRACT

Embodiments of an edge detector and related methods are disclosed. One method embodiment for detecting the rising and/or falling edge of an input clock signal of unknown phase and frequency includes providing a reference clock signal of a known phase and frequency to an edge detection circuit; dividing and phase shifting the reference clock signal to provide a plurality of meta flip-flop clock signals; providing the plurality of meta flip-flop clock signals and an input clock signal to a plurality of flip-flop pairs that provide meta-stability resolution; selecting the earliest output signal of the plurality of flip-flop pairs to register a transition on the input clock signal; providing a signal corresponding to the transition to an edge detection circuit; and providing an edge detect indication at the edge detection circuit during one of the corresponding high and low phase of the input clock signal.

27 Claims, 5 Drawing Sheets

US 7,015,726 B1

EDGE DETECTOR AND METHOD

BACKGROUND

Many integrated circuit (IC) designs use glitch-free multiplexers to dynamically switch a clock input to a given circuit in response to operating conditions or modes. As is known, a glitch is generally understood to be a very short duration change of value. For example, in the case of a 50% duty cycle clock (i.e., the clock is at a high logic level for ½ period and a low logic level for ½ period), the glitch may be a pulse on the clock line of significantly less than ½ period duration. Most glitch-free, clock multiplexing circuits require that the phase and frequency relationships of all input clocks be known in order to ensure glitch-free operation. In some IC designs, one or more of the input clocks may have unknown phase and frequency relationships to other known clocks in the design. If the input clock is unknown, a conventional edge detection circuit that detects the edge of an unknown signal typically uses a sample clock of at least twice the highest expected frequency of the input clock, but with a high probability of propagating meta-stable (i.e., ambiguous) states through down-stream logic as a result of the unknown phase relationship of the clocks.

Some IC designs incorporate a standard back-to-back flip-flop, meta-stability resolution circuit on the input clock. Such designs typically require a sample clock of at least eight (8) times the highest expected frequency of the input clock to produce an edge detection signal during the corresponding low or high phase of the input clock signal. Such a high frequency multiplier may cause unacceptable meta-stability resolve probability at the meta-stability flip-flops.

SUMMARY

One method embodiment for detecting the rising and/or falling edge of an input clock signal of unknown phase and frequency comprises providing a reference clock signal of a known phase and frequency to an edge detection circuit; dividing and phase shifting the reference clock signal to provide a plurality of meta flip-flop clock signals; providing the plurality of meta flip-flop clock signals and an input clock signal to a plurality of flip-flop pairs that provide meta-stability resolution; selecting the earliest output signal of the plurality of flip-flop pairs to register a transition on the input clock signal; providing a signal corresponding to the transition to an edge detection circuit; and providing an edge detect indication at the edge detection circuit during one of the corresponding high and low phase of the input clock signal.

An embodiment of an edge detecting apparatus comprises a phase shift and divide circuit block configured to receive a reference clock signal of a known phase and frequency and divide and phase-shift the reference clock signal to provide a plurality of meta flip-flop clock signals; a plurality of meta-stable circuit blocks configured to receive the plurality of meta flip-flop clock signals and an input clock signal of unknown phase and frequency; a transition select circuit block configured to select when the earliest of the plurality of meta-stable circuit blocks registers a transition on the input clock signal; and a plurality of edge detect circuit blocks configured to receive the reference clock signal and an output of the transition select circuit block and provide an edge detect indication during the corresponding high or low phase of the input clock signal.

Another embodiment of a an edge detecting apparatus comprises means for dividing and phase shifting a reference clock signal to provide a plurality of meta flip-flop clock signals; means for receiving the plurality of meta flip-flop clock signals and an input clock signal; means for sampling the input clock signal using the plurality of meta flip-flop clock signals as reference clocks to a plurality of sampling circuits; means for selecting the earliest transition on output signals of the plurality of sampling circuits; and means for providing an edge detect indication at the edge detection circuit during one of the corresponding high and low phase of the input clock signal, wherein the means for providing an edge detect indication includes means for receiving the reference clock signal.

BRIEF DESCRIPTION OF THE DRAWINGS

The components in the drawings are not necessarily to scale, emphasis instead being placed upon clearly illustrating the principles of the disclosed apparatus and methods. Moreover, in the drawings, like reference numerals designate corresponding parts throughout the several views.

DETAILED DESCRIPTION

Disclosed herein are various embodiments of a meta-stable tolerant edge detector and related methods. A meta-stable tolerant edge detector provides functionality that includes detecting the rising and/or falling edge of an input clock signal of unknown phase and frequency in time for multiplexer control or other circuitry to respond during the corresponding high or low phase of the input clock signal without propagating a meta-stable state to the control circuitry. The input clock may be an externally generated input clock and/or internally generated.

A meta-stable tolerant edge detector exhibits a design that addresses two competing constraints when addressing meta-stability and unknown phase and frequency relationships in integrated circuit (IC) design. First, it is desirable for the sample clock signal to have as high a frequency as possible to provide a timely edge detection indication to the consuming logic. However, for meta-stability flip-flops to effectively resolve meta-stable conditions, it is often desirable for the sample clock signal to have as low a frequency as possible to minimize the probability of propagating a meta-stable condition to the consuming logic. A meta-stable tolerant edge detector balances these competing constraints by using a fast sample clock to clock an edge detector portion of the meta-stable tolerant edge detector, and multiple divided and phase shifted versions of the sample clock to clock multiple, parallel, meta-stability resolving back-to-back flip-flops.

A meta-stable tolerant edge detector reduces the frequency of a plurality of divided and/or phase-shifted clock signals (herein referred to collectively as meta flip-flop clock signals as described below) input to meta-stability resolution circuitry to 3–4 times the highest expected frequency of the input clock while still providing an edge detect indication during the corresponding high or low phase of the input clock.

Figure 1:
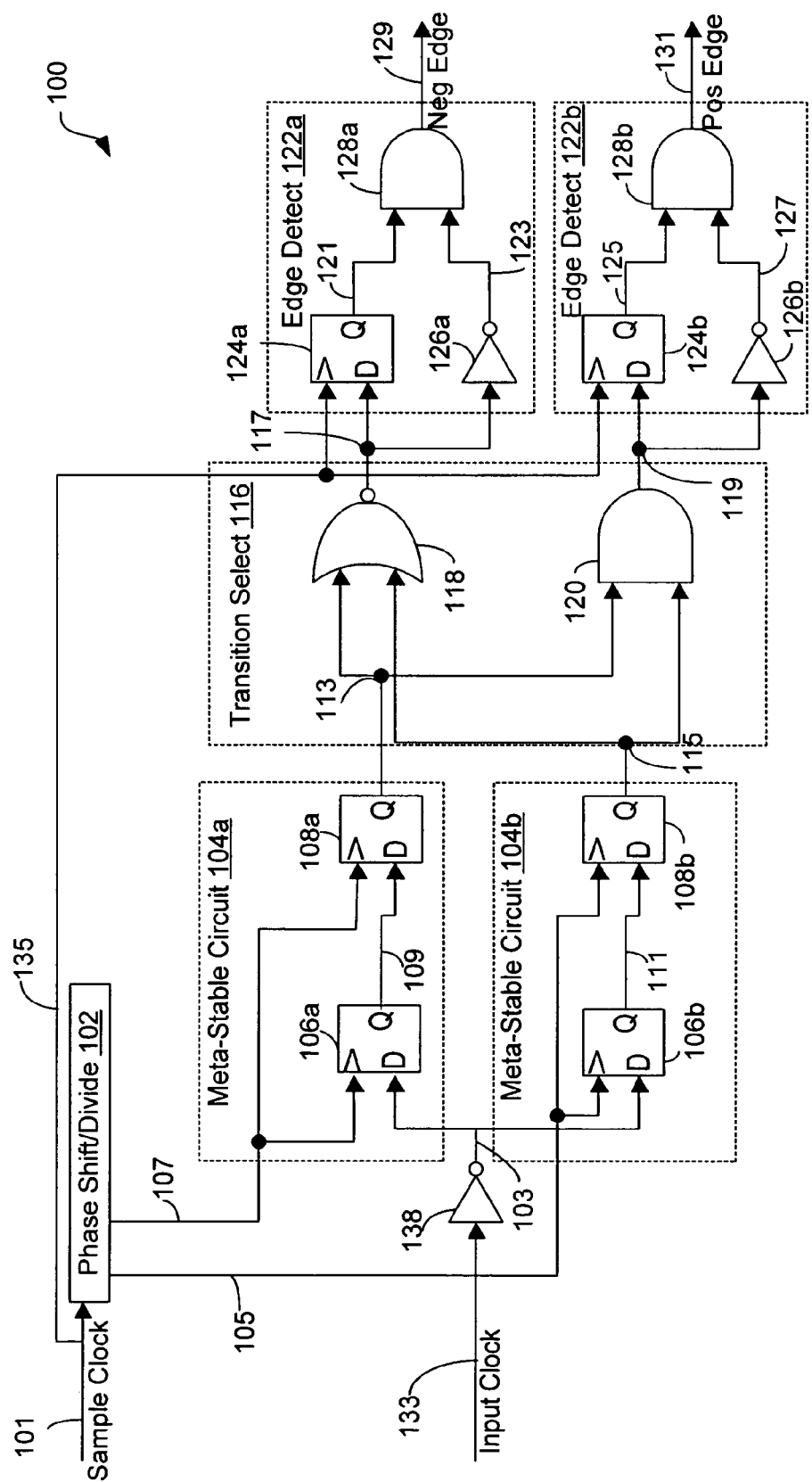
FIG. 1 is a schematic diagram that illustrates an embodiment of a meta-stable tolerant edge detector.
Figure 2:
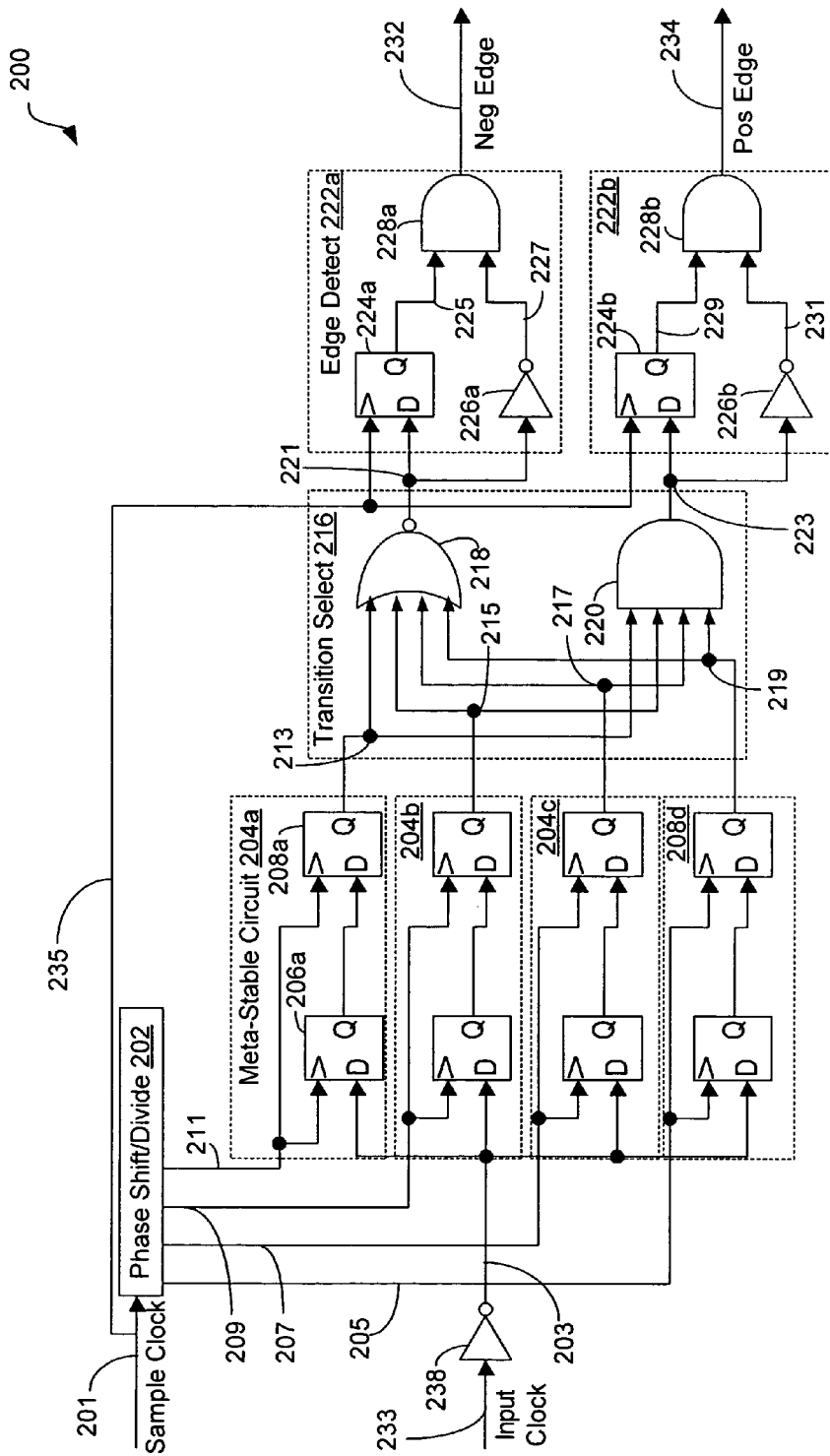
FIG. 2 is a schematic diagram that illustrates another embodiment of a meta-stable tolerant edge detector.
Figure 3:
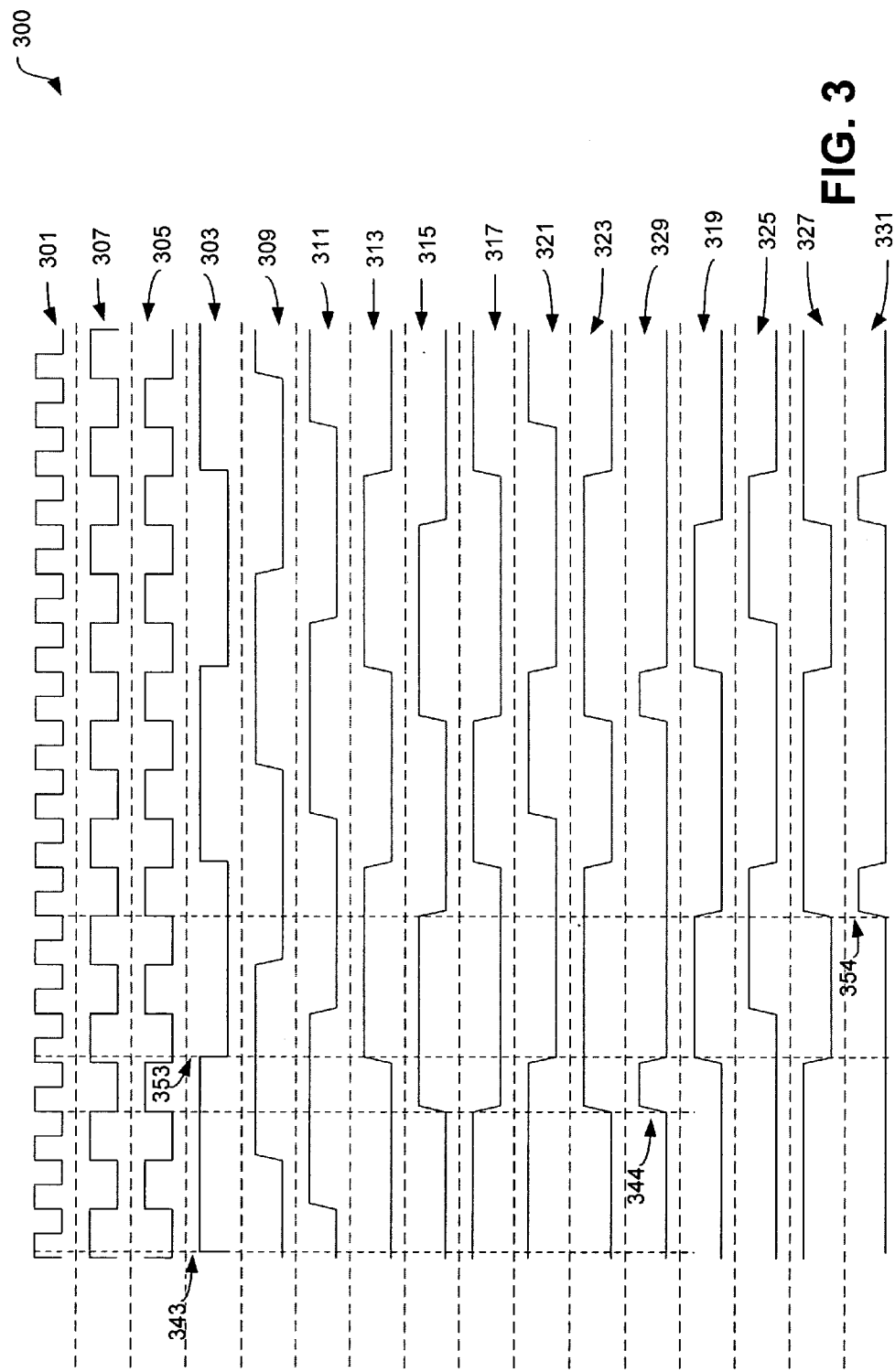
FIG. 3 is a timing diagram for an example implementation using the meta-stable tolerant edge detector embodiment shown in FIG. 1.
Figure 4:
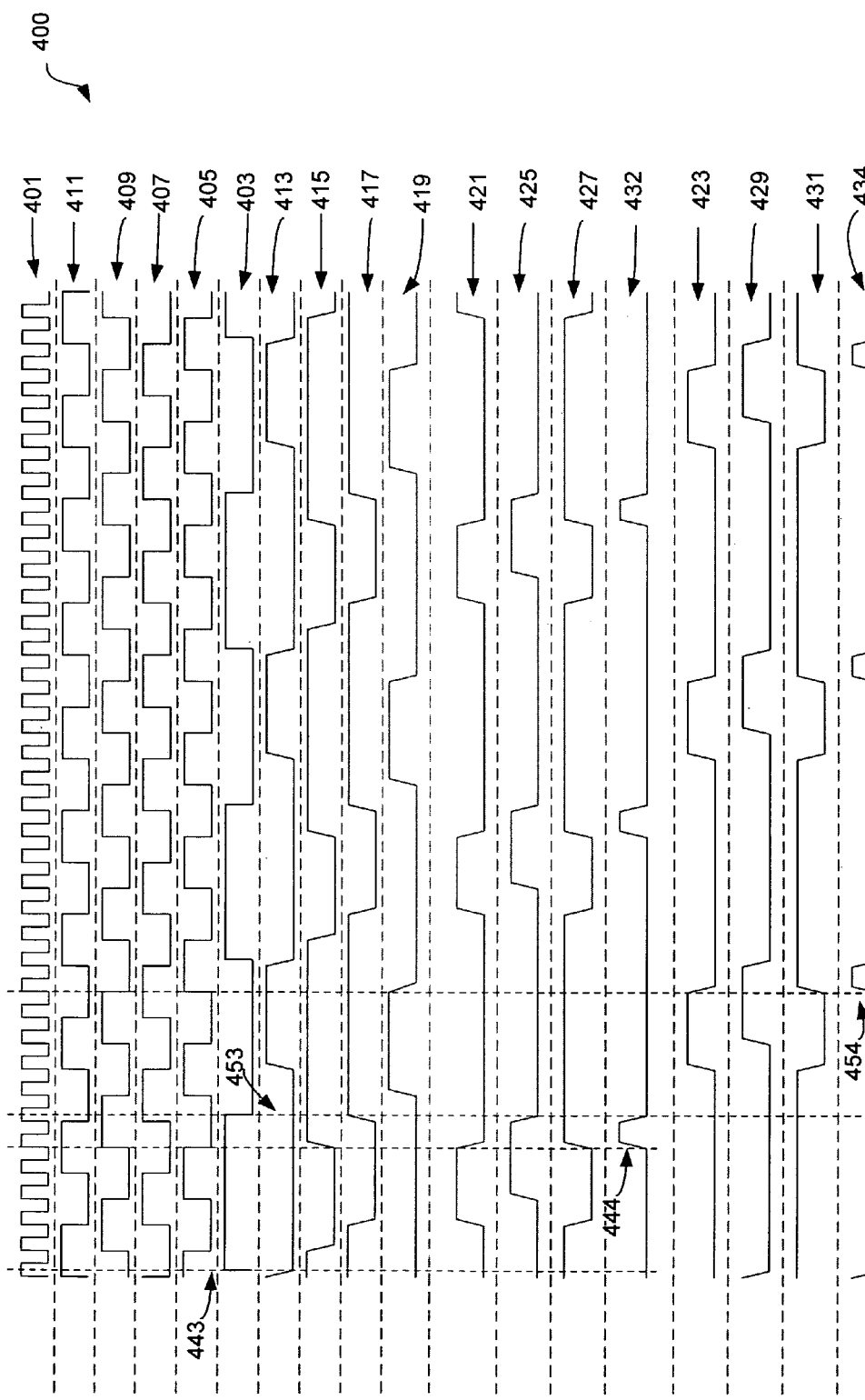
FIG. 4 is a timing diagram for an example implementation using the meta-stable tolerant edge detector embodiment shown in FIG. 2.

In the description that follows, two embodiments for a meta-stable tolerant edge detector are provided in FIGS. 1 and 2, and described in association with timing diagrams shown in FIGS. 3 and 4. Finally, a meta-stable tolerant edge detector method embodiment is described in FIG. 5.

FIG. 1 is a schematic diagram that illustrates an embodiment of a meta-stable tolerant edge detector 100. FIG. 3 is a timing diagram 300 for an example implementation using the meta-stable tolerant edge detector 100 shown in FIG. 1. FIGS. 1 and 3 will be used to describe the architecture of the meta-stable tolerant edge detector 100 and timing of the corresponding signals propagated therein, respectively, for one example implementation. The meta-stable tolerant edge detector 100 includes a phase shift and divide block 102, meta-stable circuit blocks 104a and 104b, a transition select block 116, and edge detector blocks 122a and 122b. The meta-stable tolerant edge detector 100 receives a high frequency sample (or reference) clock signal 301 on connection 101 at the phase shift and divide block 102. The meta-stable tolerant edge detector 100 also receives an input clock signal on connection 133, which is provided to an inverter 138 where it undergoes an inverting operation. The inverted input clock signal 303 output from the inverter 138 is provided to meta-stable circuit blocks 104a and 104b via connection 103. The input clock signal on connection 103 may be a clock signal of unknown phase, where the frequency of the input clock signal may also be unknown but less than or equal to a known maximum frequency.

The phase shift and divide block 102 provides division and phase shifting functionality. In one embodiment, the high frequency sample clock signal 301 on connection 101 is divided by two (2) and phase-shifted. The resulting meta flip-flop clock signals 305 and 307 on connections 105 and 107, respectively, are each four (4) times the highest expected frequency of the input clock on connection 133 and have a 180° phase relationship. Thus, the meta flip-flop clock signal 307 on connection 107 has a 0° phase shift relative to the sample clock signal 301 on connection 101, and the meta flip-flop clock signal 305 on connection 105 has a 180° phase shift relative to the sample clock signal 301.

The meta flip-flop clock signal 307 on connection 107 is provided to meta-stable circuit block 104a. The meta-stable circuit block 104a includes two flip-flops 106a and 108a, each configured for exemplary purposes as a "D" flip-flop. The meta flip-flop clock signal 307 on connection 107 is provided to a clock input terminal (herein represented by a triangle lying on its side) of flip-flop 106a and flip-flop 108a. The flip-flop input terminal (herein represented by "D") of flip-flop 106a receives the inverted input clock signal 303 via connection 103. The flip-flop input terminal (represented by "D") of flip-flop 108a receives an output signal 309 from flip-flop 106a via connection 109.

The meta flip-flop clock signal 305 on connection 105 is provided to meta-stable circuit block 104b, which is configured similarly to meta-stable circuit block 104a. The meta-stable circuit block 104b includes two flip-flops 106b and 108b, each configured in one example as a "D" flip-flop. The meta flip-flop clock signal 305 on connection 105 is provided to a clock input terminal of flip-flop 106b and flip-flop 108b. The flip-flop input terminal of flip-flop 106b receives the inverted input clock signal 303 on connection 103. The flip-flop input terminal of flip-flop 108b receives an output signal 311 from flip-flop 106b via connection 111.

As an example of the functionality provided by the meta-stable circuit blocks 104a and 104b, consider the meta-stable circuit block 104a as an illustrative example. If the inverted input signal 303 on connection 103 to the flip-flop input terminal (e.g., the "D" designated terminal) of flip-flop 106a is in transition from high to low or from low to high at the time the rising edge of the meta flip-flop clock signal 307 arrives at the flip-flop 106a, the output signal 309 of the flip-flop 106a on connection 109 may stabilize at a point between 0 and 1. This ambiguous state is referred to as meta-stability. Given the imperfections in the silicon processes and other random circuit variations, the flip-flop 106a will eventually have a state that resolves to a 1 or 0. The flip-flop 108a in a meta-stability pair (e.g., 106a and 108a) is intended to enable the flip-flop 106a to resolve the ambiguous state before the flip-flop 108a provides an output signal 313 to the transition select block 116.

The meta-stable circuit blocks 104a and 104b provide output signals 313 and 315 on connections 113 and 115 to transition select block 116, respectively. The transition select block 116 includes a NOR gate 118 and an AND gate 120. The transition select block 116 provides a signal 317 to the edge detect circuit blocks 122a and 122b when the earliest of the parallel meta-stable circuit blocks 104a or 104b registers a transition on the input clock signal on connection 133. In other words, the operation of a flip-flop is to "register" a signal. For example, the flip-flop captures (or registers) the state of an input signal (e.g., at the "D" designated terminal) at the time that the clock input signal transitions from low to high and holds that state until the next low to high transition of the clock signal. In particular, the flip-flops 108a and 108b provide output signals 313 and 315 over connections 113 and 115, respectively, to NOR gate 118 to undergo a logical NOR operation that selects the earliest low-to-high transition of the output signals 313 and 315 of the two meta-stable circuit blocks 104a and 104b, respectively. The output signal 317 of the NOR gate 118 is provided over connection 117 to the negative-edge detect circuit block 122a. Also, the flip-flops 108a and 108b provide output signals 313 and 315 over connections 113 and 115, respectively, to AND gate 120 to undergo a logical AND operation that selects the earliest high-to-low transition of the output signals 313 and 315 of the two meta-stable circuit blocks 104a and 104b, respectively. The output signal 319 of the AND gate 120 is provided over connection 119 to the positive-edge detect circuit block 122b.

The negative-edge detect circuit block 122a detects the negative edge of the input clock, and the positive-edge detect circuit block 122b, which is configured similarly to the negative-edge detect circuit block 122a, detects the positive edge of the input clock. A positive edge is the transition from a low state to a high state. A negative edge is the transition from a high state to a low state. The negative-edge detect circuit block 122a includes a "D" flip-flop 124a, as one example, an inverter 126a, and an AND gate 128a. The "D" flip-flop 124a receives the sample clock signal 301 on connection 135 at its clock input terminal. The "D" flip-flop 124a also receives the output signal 317 on connection 117 at its flip-flop input terminal. The inverter 126a receives the output signal 317 on connection 117. The output signals 321 and 323 from the "D" flip-flop 124a and the inverter 126a are provided on connections 121 and 123, respectively, to the AND gate 128a to undergo a logical AND operation. A negative edge detection signal 329 is provided at the output of the AND gate 128a on connection 129.

The positive-edge detect circuit block 122b includes a "D" flip-flop 124b, as one example, an inverter 126b, and an AND gate 128b. The "D" flip-flop 124b receives the sample clock signal 301 on connection 135 at its clock input terminal. The "D" flip-flop 124b also receives the output signal 319 on connection 119 at its flip-flop input terminal. The inverter 126b receives the output signal 319 on connection 119. The output signals 325 and 327 from the "D" flip-flop 124b and the inverter 126b are provided on connections 125 and 127, respectively, to the AND gate 128b to undergo a logical AND operation. A positive edge detection signal 331 is provided at the output of the AND gate 128b on connection 131.

Note that in some embodiments, the inverter 138 can be omitted. Omitting the inverter 138 will simply invert the sense of the edge detect output 329 on connection 129 from a negative edge to a positive edge signal, and will invert the sense of the edge detect output 331 on connection 131 from a positive edge signal to a negative edge signal.

In operation, assuming that the input clock signal on connection 133 has a 50% duty cycle, the meta-stable tolerant fast edge detection circuit 100 will detect a rising or falling edge of the input clock signal at least one phase of the sample clock 301 on connection 101 before the next input clock transition. Specifically, note that the vertical dotted line 343 in FIG. 3 indicates a rising edge of the inverted input clock signal 303 on connection 103. This rising edge corresponds to a falling edge on the input clock on connection 133. Further note that the vertical dotted line 344 in FIG. 3 indicates a rising edge on the negative edge detect output signal 329 on connection 129 in response to the rising edge 343. As shown by vertical lines 343 and 344, the negative edge detect signal 329 on connection 129 was asserted at least one phase of the sample clock 301 before the end of the corresponding low phase of the input clock signal on connection 133, which low phase of the input clock signal is represented by the high phase of the inverted input clock signal 303 on connection 103. The above discussion also applies to vertical dotted lines 353 and 354. Note that vertical dotted line 353 indicates a falling edge of the inverted input clock signal 303 (rising edge of the input clock signal on connection 133) and that vertical dotted line 354 indicates the assertion of the positive edge signal 331 at least one phase of the sample clock signal 301 before the end of the low phase of inverted input clock signal 303 (which equates to the high phase of input clock signal on connection 133).

FIG. 2 is a schematic diagram that illustrates another embodiment of a meta-stable tolerant edge detector 200. FIG. 4 is a timing diagram 400 for an example implementation using the meta-stable tolerant edge detector 200 shown in FIG. 2. FIGS. 2 and 4 will be used to describe the architecture of the meta-stable tolerant edge detector 200 and timing of the corresponding signals propagated therein, respectively, for one example implementation. The meta-stable tolerant edge detector 200 includes a phase shift and divide block 202, meta-stable circuit blocks 204a, 204b, 204c, and 204d, a transition select block 216, and edge detector circuit blocks 222a and 222b. The meta-stable tolerant edge detector 200 receives a high frequency sample clock signal 401 on connection 201 at the phase shift and divide block 202. The meta-stable tolerant edge detector 200 also receives an input clock signal on connection 233, which is provided to an inverter 238 where it undergoes an inverting operation. The output signal 403 of the inverter 238 is provided over connection 203 to meta-stable circuit blocks 204a, 204b, 204c, and 204d.

The phase shift and divide block 202 provides division and phase shifting functionality. In one embodiment, the phase shift and divide block 202 receives a high frequency sample clock signal 401 on connection 201, which is divided by four (4) and phase shifted in the phase shift and divide block 202 using commonly known methods for dividing and phase shifting clocks. The resulting meta flip-flop clock signals 405, 407, 409, and 411 on connections 205, 207, 209, and 211, respectively, are each three (3) times the highest expected frequency of the input clock signal on connection 233, and have a 90° phase relationship. That is, the meta flip-flop clock signal 411 on connection 211 has a 0° phase shift with respect to the sample clock signal 401 on connection 201. The meta flip-flop clock signal 409 on connection 209 has a 90° phase shift with respect to the sample clock signal 401 on connection 201 and with respect to the meta flip-flop clock signal 411 on connection 211. The meta flip-flop clock signal 407 on connection 207 has a 180° phase shift with respect to the sample clock signal 401 on connection 201 and a 90° phase shift with respect to the meta flip-flop clock signal 409 on connection 209. The meta flip-flop clock signal 405 on connection 205 has a 270° phase shift with respect to the sample clock signal 401 on connection 201 and a 90° phase shift with respect to the meta flip-flop clock signal 407 on connection 207.

The meta flip-flop clock signal 411 on connection 211 is provided to meta-stable circuit block 204a. The meta flip-flop clock signal 409 on connection 209 is provided to meta-stable circuit block 204b. The meta flip-flop clock signal 407 on connection 207 is provided to meta-stable circuit block 204c. The meta flip-flop clock signal 405 on connection 205 is provided to meta-stable circuit block 104d. Each of the meta stable circuit blocks 204a–204d and their respective input and output connections are similarly configured, and thus discussion of the same will be directed to the meta-stable circuit block 204a for brevity. The meta-stable circuit block 204a includes "D" flip-flops 206a and 208a. The meta flip-flop clock signal 405 on connection 205 is provided to the clock input terminals of the flip-flops 206a and 208a. The inverter output signal 403 on connection 203 is provided to the flip-flop input terminal of the flip-flop 206a. The output signal of the flip-flop 206a is provided to the input terminal of the flip-flop 208a. The output signal 413 of the flip-flop 208a is provided to the transition select block 216 via connection 213. Similarly, meta-stable circuit blocks 204b, 204c, and 204d provide output signals 415, 417, and 419 to the transition select block 216 via connections 215, 217, and 219, respectively.

The transition select block 216 includes a NOR gate 218 and an AND gate 220. The transition select block 216 provides an output signal 421 to the edge detect circuit blocks 222a and 222b when the earliest of the parallel meta-stable circuit blocks 204a, 204b, 204c, and 204d registers a transition on the input clock. In particular, the flip-flops 208a, 208b, 208c, and 208d provide output signals 413, 415, 417, and 419 over connections 213, 215, 217, and 219, respectively, to NOR gate 218 to undergo a logical NOR operation that selects the earliest low-to-high transition of the output signals 413, 415, 417, and 419 of the meta-stable circuit blocks 204a, 204b, 204c, and 204d. The output signal 421 of the NOR gate 218 is provided over connection 221 to the negative-edge detect circuit block 222a. Also, the flip-flops 208a, 208b, 208c, and 208d provide output signals 413, 415, 417, and 419 over connections 213, 215, 217, and 219, respectively, to AND gate 220 to undergo a logical AND operation that selects the earliest high-to-low transmission of the output signals 413, 415, 417, and 419 of the meta-stable circuit blocks 204a, 204b, 204c, and 204d. The output signal 423 of the AND gate 220 is provided over connection 223 to the positive-edge detect circuit block 222b.

The negative-edge detect circuit block 222a detects the negative edge of the input clock, and the positive-edge detect circuit block 222b, which is configured similarly to the negative-edge detect circuit block 222a, detects the positive edge of the input clock. The negative-edge detect circuit block 222a includes a "D" flip-flop 224a, as one example, an inverter 226a, and an AND gate 228a. The "D" flip-flop 224a receives the sample clock 401 on connection 235 at its clock input terminal. The "D" flip-flop 224a also receives the output signal 421 on connection 221 at its flip-flop input terminal. The inverter 226a receives the output signal 421 on connection 221. The output signals 425 and 427 from the "D" flip-flop 224a and the inverter 226a are provided on connections 225 and 227, respectively, to the AND gate 228a to undergo a logical AND operation. A negative edge detection signal 432 is provided at the output of the AND gate 228a on connection 232.

The positive-edge detect circuit block 222b includes a "D" flip-flop 224b, as one example, an inverter 226b, and an AND gate 228b. The "D" flip-flop 224b receives the sample clock signal 401 on connection 235 at its clock input terminal. The "D" flip-flop 224b also receives the output signal 423 on connection 223 at its flip-flop input terminal. The inverter 226b receives the output signal 423 on connection 223. The output signals 429 and 431 from the "D" flip-flop 224b and the inverter 226b are provided on connections 229 and 231, respectively, to the AND gate 228b to undergo a logical AND operation. A positive edge detection signal 434 is provided at the output of the AND gate 228b on connection 234.

Assuming that the input clock signal on connection 233 has a 50% duty cycle, this meta-stable tolerant fast edge detection circuit 200 will detect a rising or falling edge of the input clock at least one phase of the sample clock 401 on connection 201 before the next input clock transition. Specifically, note that the vertical dotted line 443 in FIG. 4 indicates a rising edge of the inverted input clock signal 403 on connection 203. This rising edge corresponds to a falling edge on the input clock on connection 233. Further note that the vertical dotted line 444 in FIG. 4 indicates a rising edge on the negative edge detection signal 432 on connection 232 in response to the rising edge 443. As shown by vertical lines 443 and 444, the negative edge detect signal 432 on connection 232 was asserted at least one phase of the sample clock signal 401 before the end of the corresponding low phase of the input clock signal on connection 233, which low phase of the input clock signal is represented by the high phase of the inverted input clock signal 403 on connection 203. The above discussion also applies to vertical dotted lines 453 and 454. Note that vertical dotted line 453 indicates a falling edge of the inverted input clock signal 403 (rising edge of the input clock signal on connection 233) and that vertical dotted line 454 indicates the assertion of the positive edge signal 434 at least one phase of the sample clock signal 401 before the end of the low phase of inverted input clock signal 403 (which equates to the high phase of input clock signal on connection 233).

Note that as the number of equally phase shifted parallel meta flip-flop stages (e.g., meta-stable circuit blocks 204a–204d) is increased, the frequency multiplier from the input clock signal to the meta flip-flop clock signal(s) required to detect an edge during the corresponding phase of the input clock signal asymptotically approaches 2. Explaining further, the Nyquist law states that in order to accurately sample a signal, the sample clock must be at least two times the highest frequency of the input signal. As noted above, placing the meta-stability flip-flops (e.g., 106a, 108a) of the meta-stable circuit blocks (e.g., 104a and 104b) before or "upstream" of the edge detect circuit (e.g., negative-edge detect circuit block 122a) significantly increases the required sample clock frequency needed to get an edge detection during the corresponding phase of the input signal. By using two (2)-180 degree phase relation clock signals and associated meta-stability flip-flops, the required sample frequency was reduced from 8 to 4 times the input clock signal frequency. By going to four (4)-90 degree phase relation clock signals and associated meta-stability flip-flops, the required sample frequency was reduced to 3 times the input clock signal frequency. If eight (8) phase clock signals and meta-stability flip-flop pairs were used a sample clock of 2.5 times the input clock signal frequency can be used. If sixteen (16) phase clock signals and meta-stability flip-flop pairs were used, a sample clock of 2.25 times the input clock signal frequency can be used. As the number of meta-stable flip-flop pairs and phase shifted clock signals increases, the required sample clock frequency approaches the Nyquist limit of 2.

Figure 5:
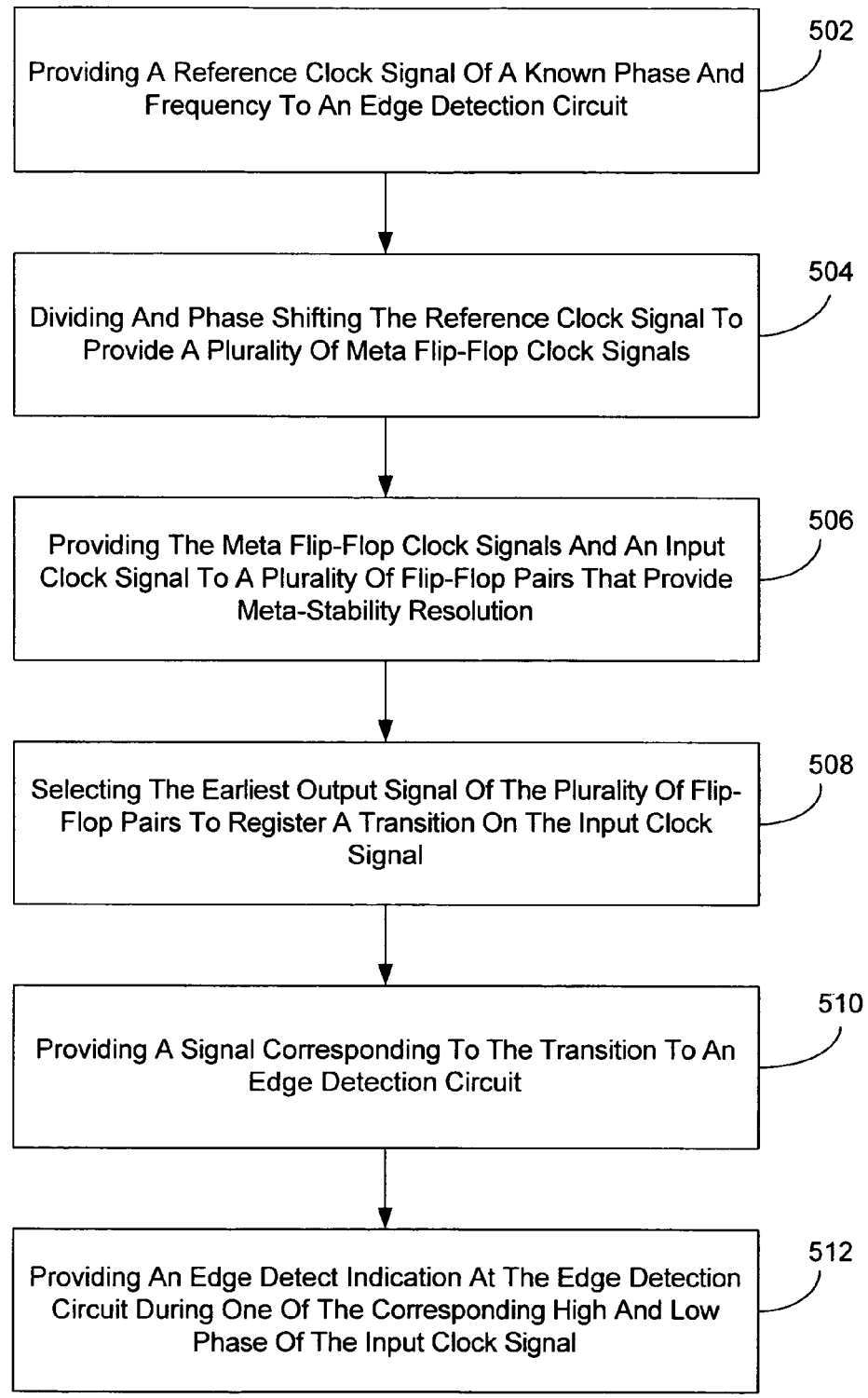
FIG. 5 is a flow diagram that illustrates one meta-stable tolerant edge detector method embodiment.

In view of the above description, it will be appreciated that one method embodiment for detecting the rising and/or falling edge of an input clock signal of unknown phase and frequency may comprise, as illustrated in FIG. 5, providing a reference clock signal of a known phase and frequency to an edge detection circuit (502), dividing and phase shifting the reference clock signal to provide a plurality of meta flip-flop clock signals (504), providing the plurality of meta flip-flop clock signals and an input clock signal to a plurality of flip-flop pairs that provide meta-stability resolution (506), selecting the earliest output signal of the plurality of meta-flip-flop pairs to register a transition on the input clock signal (508), providing a signal corresponding to the transition to an edge detection circuit (510), and providing an edge detect indication at the edge detection circuit during one of the corresponding high and low phase of the input clock signal (512).

Any process descriptions or blocks in the flow diagram of FIG. 5 should be understood as representing specific logical functions or steps in the process, and alternate implementations are included within the scope of the disclosure in which functions may be executed out of order from that shown or discussed, including substantially concurrently or in reverse order, depending on the functionality involved, as would be understood by those reasonably skilled in the art.

One or more blocks of the meta-stable tolerant edge detectors 100 (FIG. 1) and 200 (FIG. 2) can be implemented in hardware, software, firmware, or a combination thereof. When implemented in hardware, the meta-stable tolerant edge detectors 100 and 200 can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

What is claimed is:

1. A method for detecting the rising edge, falling edge, or both of an input clock signal of unknown phase and frequency, said method comprising:

providing a reference clock signal of a known phase and frequency to an edge detection circuit;

dividing and phase shifting the reference clock signal to provide a plurality of meta flip-flop clock signals;

providing the plurality of meta flip-flop clock signals and an input clock signal to a plurality of flip-flop pairs that provide meta-stability resolution;

selecting the earliest output signal of the plurality of flip-flop pairs to register a transition on the input clock signal;

providing a signal corresponding to the transition to an edge detection circuit; and providing an edge detect indication at the edge detection circuit during one of the corresponding high and low phase of the input clock signal.

2. The method of claim 1, wherein providing the plurality of meta flip-flop clock signals and an input clock signal includes providing the plurality of meta flip-flop clock signals with a frequency that is at least greater than two times the highest expected frequency of the input clock signal.

3. The method of claim 1, wherein phase-shifting includes providing a 90 degree phase separation between each of the plurality of meta flip-flop clock signals.

4. The method of claim 1, wherein phase-shifting includes providing a 180 degree phase separation between each of the plurality of meta flip-flop clock signals.

5. The method of claim 1, wherein selecting includes providing a logical AND operation between output signals of the flip-flop pairs.

6. The method of claim 1, wherein selecting includes providing a logical NOR operation between output signals of the flip-flop pairs.

7. The method of claim 1, further including resolving meta-stability at the flip-flop pairs.

8. The method of claim 1, wherein providing an edge detect indication includes providing a detection of a transition from a low state to a high state.

9. The method of claim 1, wherein providing an edge detect indication includes providing a detection of a transition from a high state to a low state.

10. The method of claim 1, wherein providing the plurality of meta flip-flop clock signals and an input clock signal includes providing an input clock signal of unknown phase and frequency, wherein the frequency is less than or equal to a defined maximum frequency.

11. An edge detecting apparatus, comprising:
a phase shift and divide circuit block configured to receive a reference clock signal of a known phase and frequency and divide and phase-shift the reference clock signal to provide a plurality of meta flip-flop clock signals;
a plurality of meta-stable circuit blocks configured to receive the plurality of meta flip-flop clock signals and an input clock signal of unknown phase and frequency;
a transition select circuit block configured to select when the earliest of the plurality of meta-stable circuit blocks registers a transition on the input clock signal; and
a plurality of edge detect circuit blocks configured to receive the reference clock signal and an output signal of the transition select circuit block and provide an edge detect indication during the corresponding high or low phase of the input clock signal.

12. The apparatus of claim 11, wherein the phase shift and divide circuit block is configured to provide the plurality of meta flip-flop clock signals with a frequency that is at least greater than two times the highest expected frequency of the input clock signal.

13. The apparatus of claim 11, wherein the phase shift and divide circuit block is configured to provide a 90 degree phase separation between the plurality of meta flip-flop clock signals.

14. The apparatus of claim 11, wherein the phase shift and divide circuit block is configured to provide a 180 degree phase separation between the plurality of meta flip-flop clock signals.

15. The apparatus of claim 11, wherein the plurality of meta-stable circuit blocks include back-to-back flip-flops that provide meta-stability resolution.

16. The apparatus of claim 11, wherein the transition select circuit block includes a NOR gate that provides a logical NOR operation between output signals of the back-to-back flip-flops and an AND gate that provides a logical AND operation between output signals of the back-to-back flip-flops.

17. The apparatus of claim 11, wherein the plurality of meta-stable circuit blocks are configured to resolve meta-stability.

18. The apparatus of claim 11, wherein the plurality of edge detect circuit blocks are configured to provide at least one of a positive sense edge detection and a negative sense edge detection.

19. The apparatus of claim 11, further including an inverter that is configured to receive the input clock signal and provide an inverted clock signal.

20. The apparatus of claim 1 wherein the plurality of edge detect circuit blocks each include an AND gate that receives output signals from an inverter and a flip-flop.

21. The apparatus of claim 11, wherein at least one of the phase shift and divide circuit block, the plurality of meta-stable circuit blocks, the transition select circuit block, and the plurality of edge detect circuit blocks are configured in hardware.

22. The apparatus of claim 11, wherein at least one of the phase shift and divide circuit block, the plurality of meta-stable circuit blocks, the transition select circuit block, and the plurality of edge detect circuit blocks are configured in software.

23. An edge detecting apparatus, comprising:
means for dividing and phase shifting a reference clock signal to provide a plurality of meta flip-flop clock signals;
means for receiving the plurality of meta flip-flop clock signals and an input clock signal;
means for sampling the input clock signal using the plurality of meta flip-flop clock signals as reference clocks to a plurality of sampling circuits;
means for selecting the earliest transition on output signals of the plurality of sampling circuits; and
means for providing an edge detect indication at the edge detection circuit during one of the corresponding high and low phase of the input clock signal, wherein the means for providing an edge detect indication includes means for receiving the reference clock signal.

24. The apparatus of claim 23, wherein the means for dividing and phase shifting includes a divide and phase shift circuit block.

25. The apparatus of claim 23, wherein the means for sampling include a plurality of meta-stability resolving, back-to-back flip-flops.

26. The apparatus of claim 23, wherein the means for selecting includes logic gates.

27. The apparatus of claim 23, wherein the means for providing an edge detect indication includes a logic gate configured to receive output signals from an inverter and a flip-flop.

* * * * *

UNITED STATES PATENT AND TRADEMARK OFFICE
CERTIFICATE OF CORRECTION

| | |
|---|---|
| PATENT NO. | : 7,015,726 B1 |
| APPLICATION NO. | : 10/926235 |
| DATED | : March 21, 2006 |
| INVENTOR(S) | : Michael Kennard Tayler et al. |

It is certified that error appears in the above-identified patent and that said Letters Patent is hereby corrected as shown below:

In column 10, line 24, in Claim 20, delete "claim 1" and insert -- claim 11, --, therefor.

Signed and Sealed this

Fourteenth Day of April, 2009

JOHN DOLL
*Acting Director of the United States Patent and Trademark Office*